(12) United States Patent
Wakejima (10) Patent No.: US 8,476,980 B2
(45) Date of Patent: Jul. 2, 2013

(54) HIGH FREQUENCY POWER AMPLIFIER

(75) Inventor: Akio Wakejima, Tokyo (JP)

(73) Assignee: NEC Corporation, Tokyo (JP)

( * ) Notice: Subject to any disclaimer, the term of this patent is extended or adjusted under 35 U.S.C. 154(b) by 10 days.

(21) Appl. No.: 13/147,456

(22) PCT Filed: Feb. 3, 2010

(86) PCT No.: PCT/JP2010/051473
§ 371 (c)(1),
(2), (4) Date: Sep. 20, 2011

(87) PCT Pub. No.: WO2010/090202
PCT Pub. Date: Aug. 12, 2010

(65) Prior Publication Data
US 2012/0188010 A1   Jul. 26, 2012

(30) Foreign Application Priority Data
Feb. 4, 2009   (JP) ................................ 2009-023531

(51) Int. Cl.
*H03F 3/60* (2006.01)
(52) U.S. Cl.
USPC ............................................ 330/301; 330/55
(58) Field of Classification Search
USPC .................. 330/124 R, 295, 301, 53–55, 286
See application file for complete search history.

(56) References Cited

U.S. PATENT DOCUMENTS
2009/0295473 A1* 12/2009 Dupuy et al. ............. 330/124 R

FOREIGN PATENT DOCUMENTS
JP  11-136011  5/1999
JP  2005-39799  2/2005

OTHER PUBLICATIONS

International Search Report, PCT/JP2010/051473, May 11, 2010.
Hu Xin, et al., "A novel dual-band balun based on the dual structure of composite right/left handed transmission line", Biophotonics, Nanophotonics and Metamaterials, 2006. Metamaterials 2006. International Symposium on, Oct. 18, 2006, pp. 529-532.
C.-H.Tseng, et al., "Wide-band balun using composite right/left-handed transmission line", Electronics Letters, Oct. 11, 2007, pp. 1154-1155.

* cited by examiner

*Primary Examiner* — Steven J Mottola
(74) *Attorney, Agent, or Firm* — Young & Thompson (57) ABSTRACT

A power amplifier includes an amplifying circuit, and first through third transmission lines. The amplifying circuit amplifies an input signal having a fundamental frequency to generate a first amplified signal and a second amplified signal whose phase is opposed to the first amplified signal. The first transmission line adds a first group of phases, different in correspondence with a frequency, to the first amplified signal by using a left-handed material to generate a first transmission signal. The second transmission line adds a second group of phases, different in correspondence with a frequency, to the second amplified signal by using a right-handed material to generate a second transmission signal. The third transmission line overlaps the first and the second transmission signals to generate an output signal. The first and the second group of phases include a phase difference configured to weaken a second harmonic and a third harmonic.

9 Claims, 7 Drawing Sheets

HIGH FREQUENCY POWER AMPLIFIER

TECHNICAL FIELD

This invention is related to a power amplifier and its power amplifying method, and especially, is related to a push-pull type power amplifier and its amplifying method.

BACKGROUND ART

As it is represented by mobile base stations, signal modulation is becoming more sophisticated in a purpose of improving a transmission rate. As a result, an amplifier is required with a high distortion characteristic, and a need is arising to make the amplifier work with a back-off bigger than a saturated output state. Therefore, a higher output is required to the amplifier. As a solution, a method of overlapping electric powers, such as a push-pull type amplifier, is used.

Figure 1:
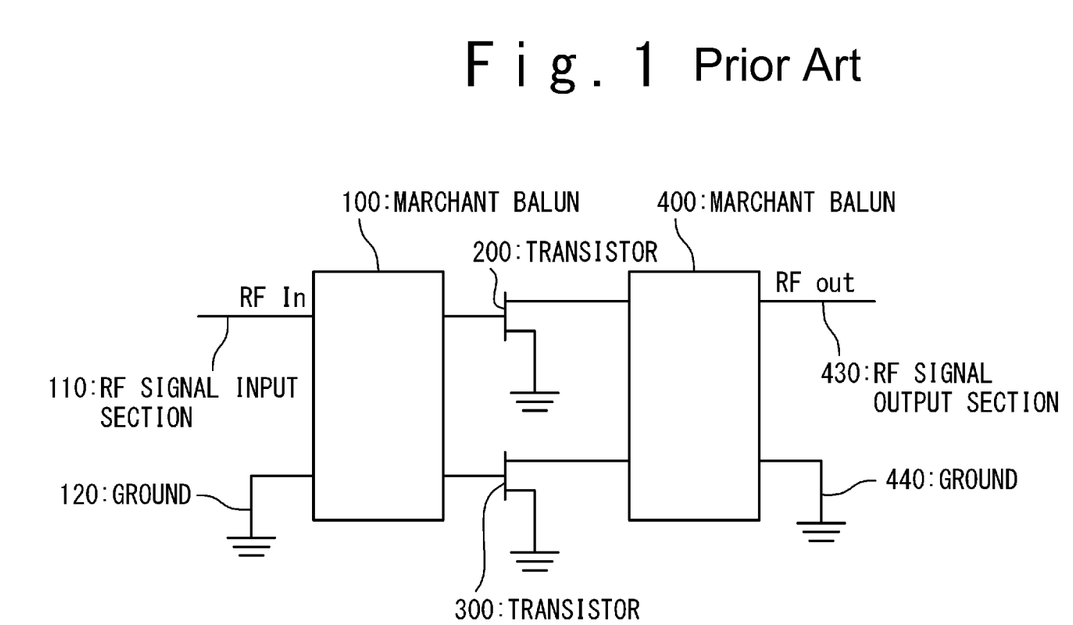
FIG. 1 is a block diagram showing a configuration of a push-pull type high frequency power amplifier of a related art.

FIG. 1 is a block diagram showing a configuration of a push-pull type high frequency power amplifier by a related art. In FIG. 1, the power amplifier of the related art includes a first marchant balun 100 as an input side balun circuit, a first transistor 200, a second transistor 300 and a second marchant balun 400 as an output side balun circuit. The first marchant balun 100 includes an RF (Radio Frequency) signal input section 110 as an input section, a ground end section grounded to a ground 120 and a first and a second output sections. The two transistors 200 and 300 have a same characteristic. The second marchant balun 400 includes a first and a second input sections, an RF signal output section 430 as an output section and a ground end section grounded to a ground 440. The first output section of the first marchant balun 100 is connected to a gate of the first transistor 200. One of a source or a drain of the first transistor 200 is connected to the first input section of the second marchant balun 400. The other of the source or the drain of the first transistor 200 is grounded. The second output section of the first marchant balun 100 is connected to a gate of the second transistor 300. One of a source or a drain of the second transistor 300 is connected to the second input section of the second marchant balun 400. The other of the source or the drain of the second transistor 300 is grounded.

Figure 2:
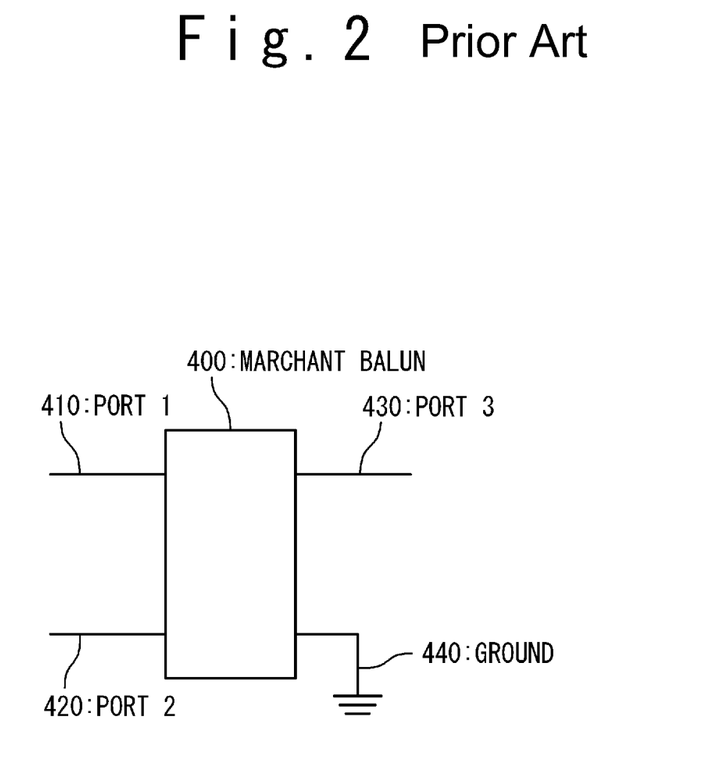
FIG. 2 is a block diagram showing ports of an output side balun circuit of the related art.

FIG. 2 is a schematic diagram showing a port of an output side balun circuit of the related art in FIG. 1. This is the marchant balun 400 as an output side balun circuit and includes a first port 410 as a first input section, a second port 420 as a second input section, a third port 430 which is shown in FIG. 1 as the RF signal output section 430 and a ground end section grounded to the ground 440. For example, in a case in which this marchant balun 400 is used as the output side balun circuit, a signal outputted by the first transistor 200 to the marchant balun 400 is provided to the first port 410 to be transmitted to the third port 430. Similarly, a signal outputted by the second transistor 300 to the marchant balun 400 is provided to the second port 420 to be transmitted to the third port 430.

Here, a distance between the first port 410 and the third port 430 is to be set half a wavelength of a fundamental wave of the inputted signal longer than a distance between the second port 420 and the third port 430. In this way, it is possible to overlap signals outputted by the first transistor 200 and the second transistor 300 and having $\pi$ radians of phase difference, with no loss.

However, here, second harmonics, which are generated by the two transistors 200 and 300, have a same phase.

A case in which a usual microstrip line is used as an output side balun circuit will be considered. Here, for a second harmonic, a difference between a distance from the first port 410 to the third port 430 and a distance from the second port 420 to the third port 430 corresponds to a zero phase difference. Consequently, in such balun circuit, the second harmonics are perfectly overlapped.

Also, for a third harmonic, a difference between the distance from the first port 410 to the third port 430 and the distance from the second port 420 to the third port 430 is 1.5 wave lengths long, and it corresponds to $\pi$ radians of phase difference. Consequently, the third harmonics, which are outputted by the first transistor 200 and the second transistor 300 with a $\pi$ radians phase difference, similarly to the fundamental wave, is overlapped in almost same phase. That is, in such balun circuit, there is no effect of cancelling the third harmonics.

Next, a case in which the marchant balun 400 is used as an output side balun circuit will be considered. Here, for the second harmonic, the distance from the first port 410 to the third port 430 becomes almost ½ wave length longer than the distance from the second port 420 to the third port 430. This makes a cancelling effect acting to the second harmonics and a distortion reduction effect is obtained.

However, here, the third harmonics are overlapped in almost same phase, similarly to the fundamental wave. For this reason, the cancelling effect for the third harmonic is very small.

As explained above, in a case in which a balun circuit is prepared by controlling a length of an ordinary transmission line and a difference of ½ wave length in a fundamental frequency is realized, the cancelling effect is not obtained for neither the second harmonic nor the third harmonic. Also, in a case in which a balun circuit such as the marchant balun is used, the difference becomes almost ½ wave length for the second harmonic, and a certain level of a cancelling effect for the second harmonic is obtained. However, due to a frequency dependence of the difference of balun circuit length, a perfect cancelling effect can not obtained. In addition, there is almost no cancelling effect for the third harmonic.

That is, it was difficult with the above mentioned balun circuit of the related art to realize a difference of ½ wave length for the fundamental wave, a difference of ½ wave length for the second harmonic and no difference of wave length for the third harmonic at same time. For this reason, the distortion characteristic of the amplifier was bad, and, to obtain a desired distortion characteristic of a system, there were a need to add a supplementary distortion compensation circuit and a problem that the amplifier becomes bigger.

Relating to the above, a mention about a power amplifier is disclosed in patent literature 1 (Japanese Laid-Open Application 2005-39799). The power amplifier mentioned in the patent literature 1 is to amplify a high frequency signal. This power amplifier includes a first amplifying device, a second amplifying device, a first distributed transmission line, a first resonating circuit and an output end. Here, the first amplifying device is to amplify a first signal. The second amplifying device is connected to the first amplifying device in a push-pull style and is to amplify a second signal having a phase opposite to the first signal. The first distributed constant line has a line length which inverts a phase of the fundamental wave component of the first signal amplified by the first amplifying device. The first resonating circuit is connected between a position on the first distributed constant line where a phase of a component of an even-order harmonic to be short-circuited is inverted and an output side of the second amplifying device, and is to resonate in series in a frequency of the component of the even-order harmonic to be short-circuited. The output end is to output after overlapping a signal from the first distributed constant line and a signal from the second amplifying device.

CITATION LIST

Patent Literature

PTL 1: Japanese Laid-Open Application 2005-39799

SUMMARY OF INVENTION

An object of the present invention is to provide a push-pull type power amplifier and its power amplifying method both of which can realize a low distortion characteristic of a balun circuit by improving a cancelling effect for a second harmonic and a third harmonic.

A power amplifier of the present invention includes an amplifying circuit (100, 200, and 300), a first transmission line (530), a second transmission line (520) and a third transmission line (540). Here, the amplifying circuit (100, 200, and 300) amplifies an input signal having a fundamental frequency, and generates a first amplified signal and a second amplified signal of which a phase is in opposition with the first amplified signal. The first transmission line (530) uses a left-handed material to add a first group of phases, which are different in correspondence with a frequency, to the first amplified signal to generate a first transmission signal. The second transmission line (520) uses a right-handed material to add a second group of phases, which are different in correspondence with a frequency, to the second amplified signal to generate a second transmission signal. The third transmission line (540) overlaps the first and the second transmission signals to generate an output signal. However, the first and the second groups of phases include a phase difference which weakens a second and a third harmonics having a frequency respectively two times and three times higher than a fundamental frequency.

A power amplifying method of the present invention includes a step (a) of amplifying an input signal having a fundamental frequency and generating a first amplified signal and a second amplified signal of which a phase is in opposition with the first amplified signal, a step (b) of adding a first group of phases, which are different in correspondence with a frequency, to a first amplified signal by using a left-handed material, a step (c) of adding a second group of phases, which are different in correspondence with a frequency, to a second amplified signal by using a right-handed material and a step (d) of overlapping the first transmission signal obtained in the step (b) and the second transmission signal obtained in the step (c). Here, there is a phase difference which weakens a second harmonic and a third harmonic which respectively have a frequency two times higher and three times higher than the fundamental frequency.

The left-handed transmission line and a right-handed transmission line are combined to provide an output side balun circuit and a phase difference in the fundamental wave is generated between the left-handed transmission line and the right-handed transmission line. In addition, it is possible to improve a cancelling effect for the second harmonic and the third harmonic by controlling values of each inductor and each condenser.

DESCRIPTION OF EMBODIMENTS

Hereinafter, an exemplary embodiment to realize a power amplifier of the present invention and its power amplifying method is described with reference to attached drawings.

Figure 3:
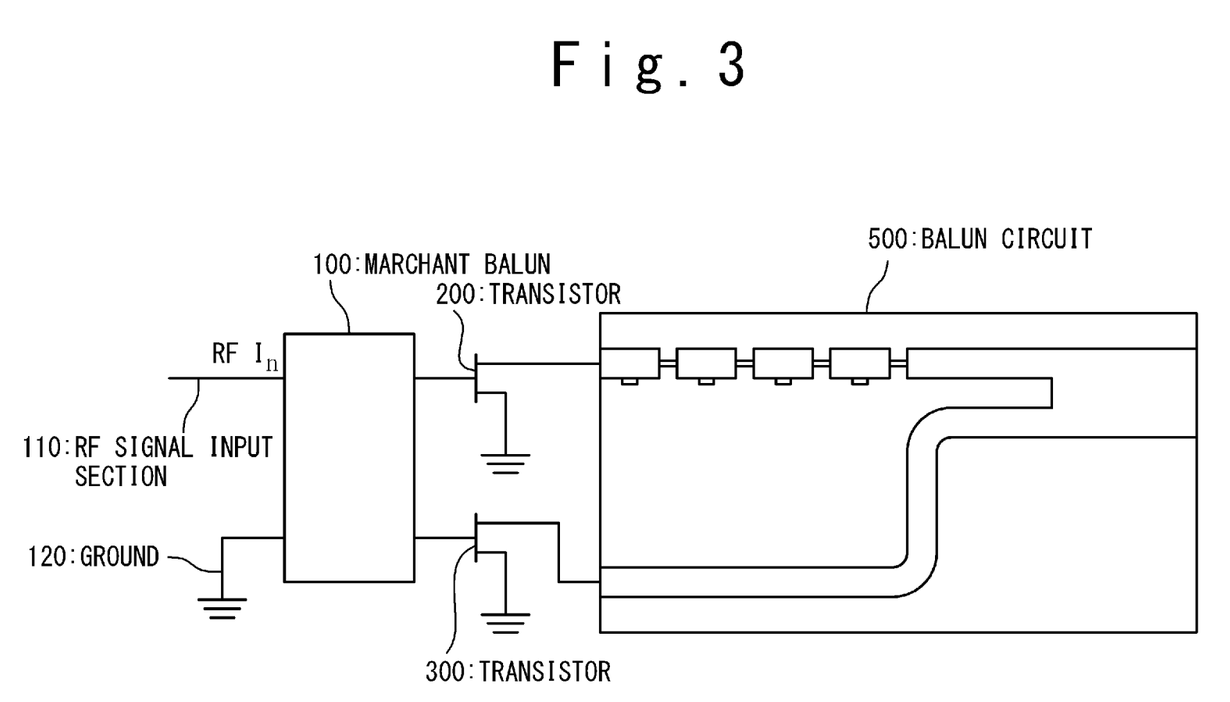
FIG. 3 is a block diagram for explaining an overall configuration of the power amplifier of an exemplary embodiment of the present invention.

FIG. 3 is a block diagram for explaining an overall configuration of the power amplifier of an exemplary embodiment of the present invention. This power amplifier includes a marchant balun 100, a first transistor 200, a second transistor 300 and an output side balun circuit 400. However, in FIG. 3, a bias circuit for the two transistors 200 and 300 to work is not shown.

The marchant balun 100 includes an RF signal input section 110, a ground end grounded to a ground 120, a first output section and a second output section.

The first transistor 200 and the second transistor 300 have a same characteristic and perform a push-pull type power amplification. Here, an FET is used as an example of a transistor, but other transistors can be used instead. The explanation is continued by assuming that each of the two transistors 200 and 300 has a source, a gate and a drain.

The output side balun circuit 400 includes a first input section, a second input section and an output section. The detail will be described below.

The first output section of the marchant balun 100 is connected to the gate of the first transistor 200. The second output section of the marchant balun 100 is connected to the gate of the second transistor 300. The source of the first transistor 200 and the source of the second transistor 300 both are grounded to the ground, respectively. The drain of the first transistor 200 and the drain of the second transistor 300 are connected to the first input section and the second input section of the balun circuit 500, respectively. However, the sources and the drains in this explanation can be replaced accordingly to a polarity of the two transistors 200 and 300.

Figure 4A:
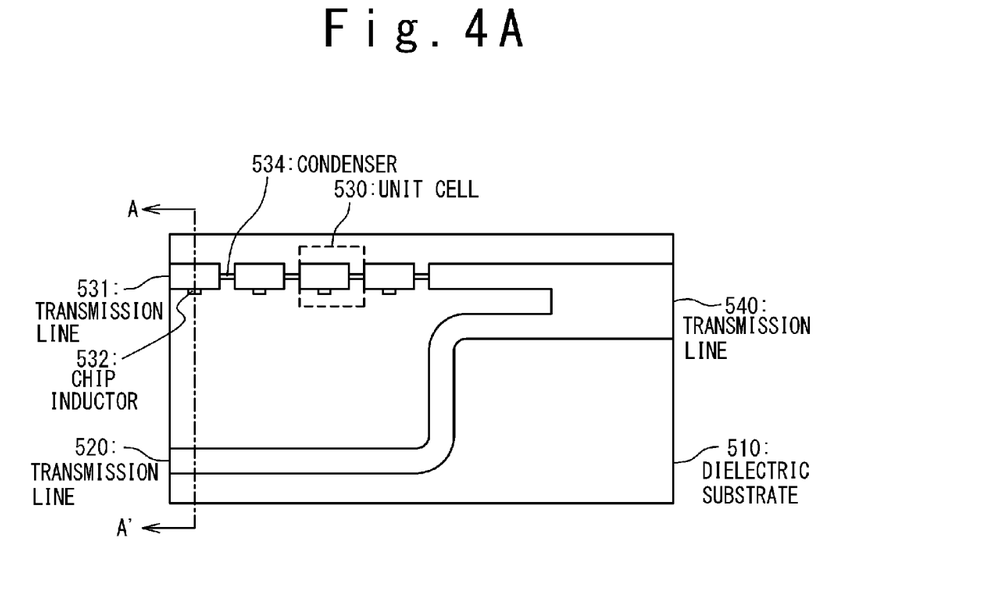
FIG. 4A is a face view for explaining an overall configuration of the output side balun circuit of the embodiment of the present invention.
Figure 4B:
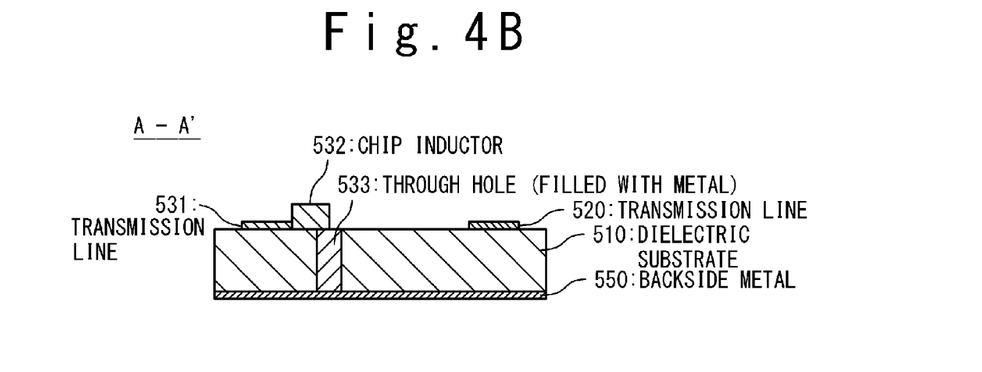
FIG. 4B is a cross-sectional view of the balun circuit in FIG. 4A by A-A'.

FIG. 4A is a face view for explaining an overall configuration of the output side balun circuit 500 of the exemplary embodiment of the present invention. FIG. 4B is a cross-sectional view of the balun circuit 500 in FIG. 4A by A-A'. This balun circuit 500 includes a dielectric substrate 510, a transmission line 520 in correspondence with the second input section, a plurality of unit cells 530 in correspondence with the first input section, a transmission line 540 in correspondence with the output section and a backside metal 550. Here, a total number of the unit cells is shown by $N_1$. $N_1$ is 4 in FIG. 4A, but is not limited in this value. However, $N_1$ is to be a integer greater than 2. Here, four unit cells 530 are called as first to fourth unit cells, in order from the left side.

The transmission line 520 and the transmission line 540 are disposed on one surface of the dielectric substrate 510, and the backside metal 550 is disposed on the other surface of the dielectric substrate 510. In other words, the transmission line 520 and the transmission line 540 are isolated from the backside metal 550 by the dielectric substrate 510. The backside metal 550 is connected to the ground.

Each of the plurality of unit cells 530 includes a transmission line 531, a chip inductor 532, a through hole 533 and a condenser 534. Here, the through hole 533 is penetrating the dielectric substrate 510, and a metal is filled inside. Also, the transmission line 531 is disposed on the same surface of the dielectric substrate 510 as the transmission line 520 and the transmission 540 are disposed on.

Connection relationship of each elements of the first unit cell 530 will be described. The drain of the first transistor 200 is connected to the transmission line 531 of the unit cell 530. This transmission line 531 is connected to a first connection section of the chip inductor 532 and a first connection section of the condenser 534. A second connection section of the chip inductor 532 is connected to the backside metal 550 via the metal filled in the through hole 533. A second connection section of the condenser 534 is connected to the transmission line 531 of the second unit cell 530.

It can be generalized that the condenser 534 of the $i^{th}$ unit cell 530 is connected to the transmission line 531 of the $i+1^{th}$ unit cell 530. $N_1$ unit cells 530, which are connected in series in this way, have a characteristic of a so-called left-handed material having a negative refractive index, that is, a negative permittivity and a negative permeability, and act as a so-called left-handed transmission line. However, the transmission lines 520 and 540 are ordinary transmission lines configured with ordinary material, but one can say that they are so-called right-handed transmission lines configured with a so-called right-handed material.

The condenser 534 of the last unit cell 530 is connected to the transmission line 540 as the output section.

The drain of the transistor 300 is connected to one end of the transmission line 520 as the second input section of the balun circuit 500. The other end of the transmission line 520 is connected to the transmission line 540. This transmission line 520 is an ordinary, so-called right-handed transmission line.

That is, the biggest characteristic of the output side balun circuit in this exemplary embodiment is, one can say, the point that, between two input transmission lines, the one is a left-handed transmission line and the other is a right-handed transmission line. However, the method of realizing a left-handed transmission line can be any other disposition but above mentioned assembly of unit cells.

The operation of the push-pull type power amplifier disposed as above, that is, the power amplifying method of the present invention, will be described.

First, the operation of the marchant balun 100 as an input side balun circuit will be described. The marchant balun 100 distributes a high frequency signal provided in the RF signal input section 110 into two signals which are equal in power. Here, between these two signals, π radians phase difference is provided. Between these two signals, the one is provided to the gate of the first transistor 200, and the other is provided to the gate of the second transistor 300, respectively.

Next, the operation of the first transistor 200 and the second transistor 300 will be described. The two transistors 200 and 300 configured as above, together act as a push-pull type power amplifier. The transistors 200 and 300 as a push-pull type power amplifier generate harmonics having frequencies n times higher than the fundamental frequency, when amplifying the two signals outputted by the marchant balun 100. These harmonics are generated by nonlinear characteristics of each of transistors 200 and 300.

Here, if the phase of the fundamental wave of the signal amplified and outputted by the first transistor 200 is set to "0" as a reference, the phase of the second harmonic generated by the first transistor 200 is π radians. Similarly, the phase of the third harmonic generated by the first transistor 200 is 0.

Also, the phase of the fundamental wave of the signal amplified and outputted by the second transistor 300 is π radians, and the phase of the second harmonic generated by the second transistor 300 is π radians. Similarly, the phase of the third harmonic generated by the second transistor 300 is π radians.

Next, the operation of the output side balun circuit 500 will be described. The signal outputted by the drain of the first transistor 200 is provided to the left-handed transmission line of the output side balun circuit 500, so that π radians phase difference is realized for the fundamental wave and the second harmonic.

Here, the inductance, that each of chip inductors 532 of the output side balun circuit 500 has, is shown by $L_1$. Similarly, the capacity that each condenser 534 has is shown by $C_1$. Also, the frequency of the input signal, that is, the fundamental frequency of the signal outputted by the push-pull type power amplifier circuit section, is shown by $f_1$.

The phase of left-handed line section using $L_1$ and $C_1$ is shown by φL. φL is calculated by the equation below.

$$\phi L = N_1/(f_1 \cdot 2 \cdot \pi \cdot (L_1 \cdot C_1)^{1/2}) \quad \text{(Equation 1)}$$

Here, by defining as below, $$Q = N_1/(2 \cdot \pi \cdot (L_1 \cdot C_1)^{1/2}) \quad \text{(Equation 2)}$$

it can be written as below.

$$\phi L = Q/f_1 \quad \text{(Equation 3)}$$

Also, the phase difference of the right-handed transmission line is shown by φR. If the right-handed transmission line is shown by an equivalent circuit, this equivalent circuit includes an inductor connected in series and a grounded condenser. The inductance of the inductor connected in series is shown by $L_2$ and the capacity of the grounded condenser is shown by $C_2$. Here, φR is calculated by the equation below.

$$\phi R = -N_2 \cdot 2 \cdot \pi \cdot (L_2 \cdot C_2)^{1/2} \cdot f_1 \quad \text{(Equation 4)}$$

Here, by defining as below, $$P = N_2 \cdot 2 \cdot \pi \cdot (L_2 \cdot C_2)^{1/2} \quad \text{(Equation 5)}$$

it can be written as below.

$$\phi R = -P \cdot f_1 \quad \text{(Equation 6)}$$

The signal via the left-handed transmission line and the signal via the right-handed transmission line are overlapped in the output side transmission line 540. Here, the phase difference between the transmission line from the port 1 to the port 3 and the transmission line from the port 2 to the port 3 is shown by Δφ. Δφ is equal to the difference between φL, the phase difference of the above left-handed transmission line, and φR, the phase difference of the above right-handed transmission line, and can be calculated by the equation below.

$$\Delta\phi = \phi L - \phi R \quad \text{(Equation 7)}$$

Figure 5:
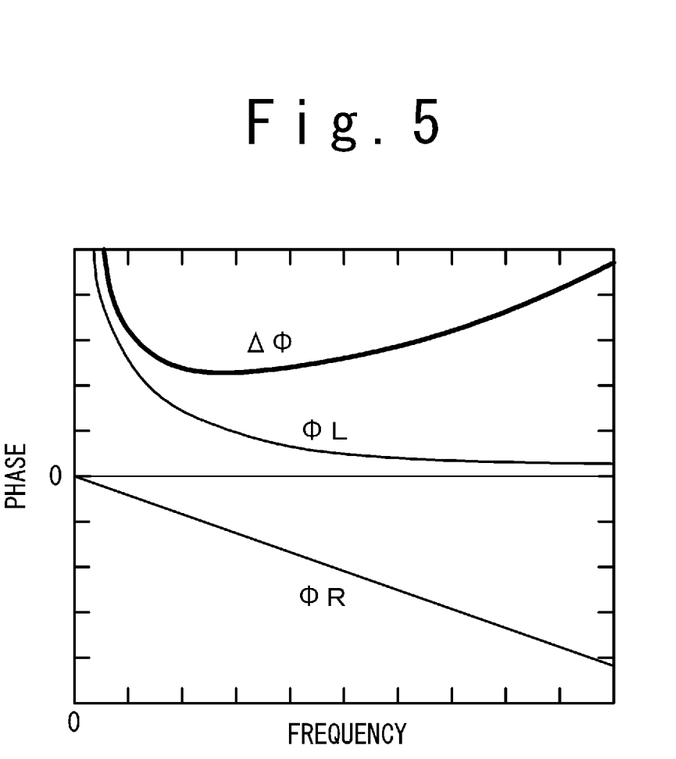
FIG. 5 is a graph showing an example of change of each phase difference of the output side balun circuit in correspondence with a change of frequency of the input signal.

FIG. 5 is a graph showing an example of change of each of phase differences φL, φR and Δφ of the output side balun circuit in correspondence with a change of frequency of the input signal.

A case in which the phase difference Δφ is π (modulo 2π) radians at the fundamental frequency $f_1$ will be considered. In this case, the power amplifier of this exemplary embodiment operates as a perfect push-pull type amplifier. It is equivalent to say that the relationship below is satisfied with any integer n.

$$Q/f_1 + P \cdot f_1 = (2n+1) \cdot \pi \quad \text{(Equation 8)}$$

A change of Δφ, the phase difference in correspondence with the frequency between $f_1$, the fundamental frequency, and the frequency of the second harmonic ($2 \cdot f_1$), will be considered. When the frequency $f_1$ increases, φL decreases in accordance with the equation 1 and (−φR) increases in accordance with the equation 2. Consequently, in this frequency band, the phase does not change greatly, and the phase difference Δφ at the frequency of the second harmonic $2 \cdot f_1$ also is almost π radians. Therefore, the cancelling effect is sufficiently obtained in the second harmonic frequency too.

In addition, the phase difference Δφ can be set to π (modulo 2π) radians at the second harmonic frequency ($2 \cdot f_1$) of the amplifier. That is, with any integer n', the equation 8 and the equation below can be realized simultaneously.

$$Q/(2 \cdot f_1) + 2 \cdot P \cdot f_1 = (2 \cdot n'+1) \cdot \pi \quad \text{(Equation 9)}$$

In this case, the second harmonic is almost completely cancelled and a push-pull type power amplifier with less distortion can be realized.

In particular, a case in which n=0 in equation 8 and n'=0 in equation 9 will be considered. That is, the left-handed transmission line and the right-handed transmission line are provided in such manner that the two relationships below be satisfied.

$$P = \pi/(3 \cdot f) \quad \text{(Equation 10)}$$

$$Q = 2 \cdot \pi \cdot f/3 \quad \text{(Equation 11)}$$

In this case, line length can be shortened overall. That is, the push-pull type power amplifier, in which the second harmonic is almost completely cancelled and of which the distortion is low, can be provided with less loss.

Next, cancelling the third harmonic will be considered. For this purpose, the value of the phase difference Δφ is set to 0 (modulo 2π) radians at the frequency of the third harmonic ($3 \cdot f_1$) of the fundamental frequency $f_1$, by satisfying the equation 8 in same time. This is equivalent to satisfy the relationship below with any integer n".

$$Q/(3 \cdot f_1) + 3 \cdot P \cdot f_1 = 2 \cdot n'' \cdot \pi \quad \text{(Equation 12)}$$

When the equation 8 and the equation 12 are simultaneously satisfied, a push-pull type power amplifier, with which the third harmonic is almost completely cancelled and of which the distortion is low, can be realized.

In particular, a case in which n=0 in equation 8 and n"=0 in equation 12 will be considered. That is, the left-handed transmission line and the right-handed transmission line are provided in such manner that the relationships below be satisfied.

$$P = 5 \cdot \pi/(8 \cdot f) \quad \text{(Equation 13)}$$

$$Q = 3 \cdot \pi \cdot f/8 \quad \text{(Equation 14)}$$

In this case, line length can be shortened overall. That is, the push-pull type power amplifier, in which the third harmonic is almost completely cancelled and of which the distortion is low, can be provided with less loss.

The ideal with the power amplifier of the present invention is to perform a perfect cancel in all of the fundamental frequency, the second harmonic frequency and the third harmonic frequency, simultaneously. For this purpose, the value of the phase difference needs to be set to π (modulo 2π) radians in the fundamental frequency and the second harmonic frequency and 0 (modulo 2π) radian in the third harmonic frequency, simultaneously. But a solution simultaneously satisfying the equation 8, the equation 9 and the equation 12 does not exist mathematically.

However, in the present invention, it is possible to set the value of the phase difference Δφ to π (modulo 2π) radians at the fundamental frequency, π±π/3 (modulo 2π) radians in the second harmonic frequency and ±π/3 (modulo 2π) radians in the third harmonic frequency. Here, while the cancelling effect is not perfect, it was verified that big enough cancelling effect can be realized for both the second harmonic and the third harmonic. Consequently, it became possible to provide a power amplifier of which the distortion characteristic is more improved.

More specifically, the left-handed transmission line and the right-handed transmission line are provided in such manner that the relationships below be satisfied with any integers n, n' and n".

$$Q/f_1 + P \cdot f_1 = (2n+1) \cdot \pi \quad \text{(Equation 15)}$$

$$(2n'+1) \cdot \pi - \pi/3 < Q/(2 \cdot f_1) + 2 \cdot P \cdot f_1 < (2n'+1) \cdot \pi + \pi/3 \quad \text{(Equation 16)}$$

$$2n'' \cdot \pi + \pi/3 < Q/(3 \cdot f_1) + 3 \cdot P \cdot f_1 < 2n'' \cdot \pi + \pi/3 \quad \text{(Equation 17)}$$

Figure 6:
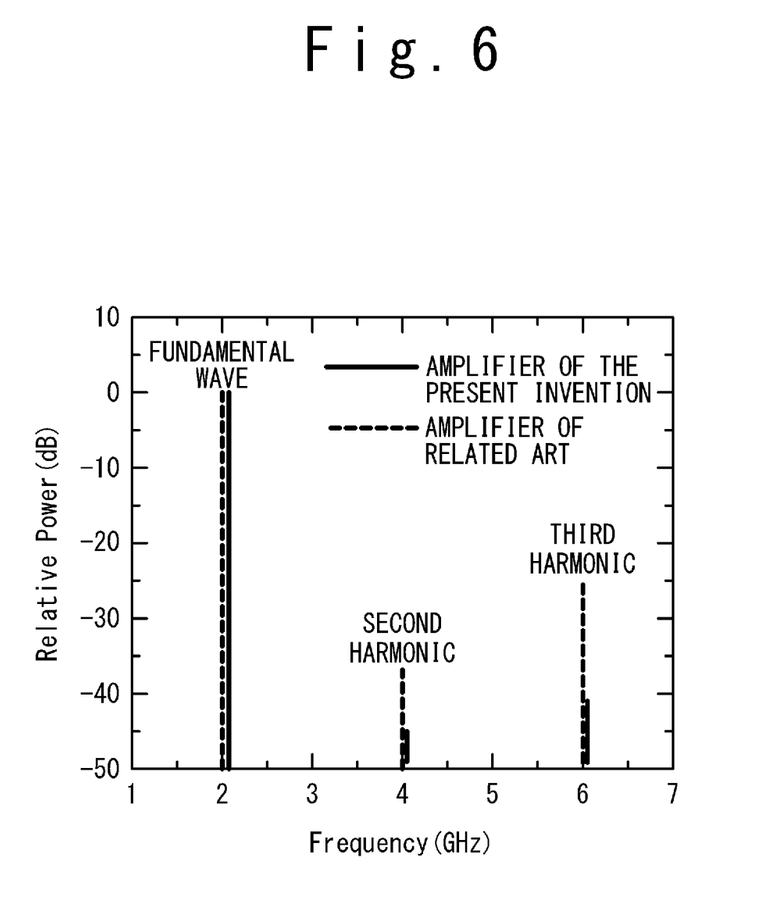
FIG. 6 is a graph for comparing output spectra which are obtained by inputting a same signal to the power amplifier of the present invention and the power amplifier of the related art.

FIG. 6 is a graph for comparing output spectra which are obtained by inputting a same signal to the power amplifier of the present invention and the power amplifier of the related art of FIG. 1. In this graph, the horizontal axis shows the frequency of the output signal, the fundamental frequency is 2 GHz, as same as the input signal, the second harmonic frequency is 4 GHz and the third harmonic frequency is 6 GHz. Also, the vertical axis shows a relative power normalized by the output power at the fundamental frequency.

Though the both fundamental wave output powers have no difference, it can be understood that, at the second harmonic frequency and at the third harmonic frequency, the power amplifier of the present invention can reduce the output power of more than 10 dB compared with the related art.

Figure 7A:
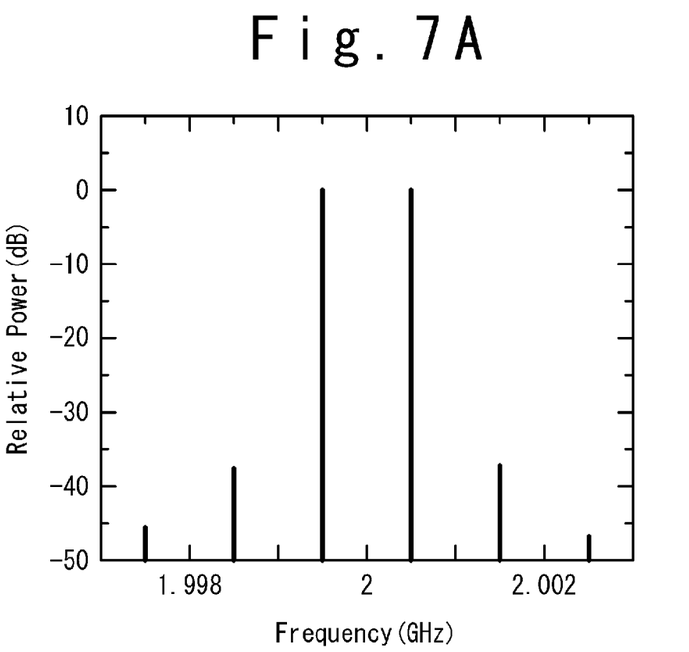
FIG. 7A is a graph showing an output spectrum of the power amplifier of the present invention.
Figure 7B:
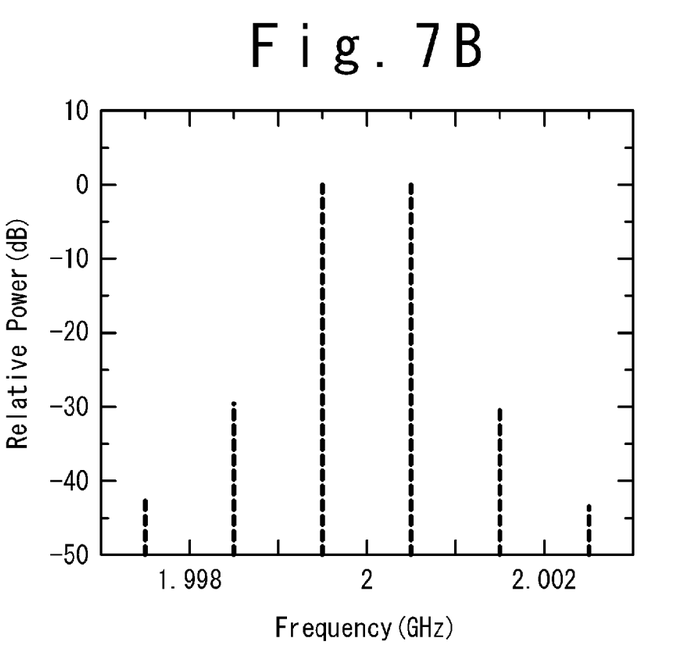
FIG. 7B is a graph showing an output spectrum of the power amplifier of the related art.

FIG. 7A is a graph showing an output spectrum of the power amplifier of the present invention. FIG. 7B is a graph showing an output spectrum of the power amplifier of the related art. By comparing the two graphs, it can be understood that the power amplifier of the present exemplary embodiment is capable of reducing the third order distortion of about 10 dB.

In the above exemplary embodiment, a chip shaped ones are used as condensers and inductors, but this is not a limitation. For example, inter-digit type one and MIM capacitor can be used as a condenser, and a transmission line such as a microstrip line on a dielectric substrate can be used as an inductor.

Also, in the above exemplary embodiment, a unit cell is defined as a short transmission line with an inductor, added between the transmission line and the ground, and a condenser, connected in series to the transmission line, and a transmission line wherein such unit cells are connected in series is provided, but this is not a limitation. For example, a transmission line wherein similar unit cells are connected in series in a long transmission line can be used, and a combination of both of them can also be used.

Examples of the power amplifier and the power amplifying method of the present invention are described below as appendixes.

APPENDIX 1

The power amplifier of the present invention can comprise:
an input side balun circuit section configured to separate an input signal into a first signal and a second signal having a phase opposite to the first signal;
a first amplifier configured to amplify the first signal;
a second amplifier, having a same characteristic as the first amplifier and configured to amplify the second signal with a same condition as the first signal; and
an output side balun circuit configured to input and overlap a first amplified signal outputted by the first amplifier and a second amplified signal outputted by the second amplifier,
wherein the output side balun circuit comprises:
a left-handed transmission line configured to transmit the first amplified signal;
a right-handed transmission line configured to transmit the second amplified signal; and
an output transmission line configured to overlap an output signal of the left-handed transmission line and an output signal of the right-handed transmission line.

APPENDIX 2

The power amplifier of the present invention can be according to the power amplifier of the above appendix 1,
wherein the left-handed transmission line comprises a plurality of unit cells connected in series, and
wherein each of the plurality of unit cells comprises:
a grounded inductance; and
a condenser connected to the first input transmission line in series.

APPENDIX 3

The power amplifier of the present invention can be according to the above appendix 1 or 2,
wherein the right-handed transmission line comprises a length configured to generate a given phase difference in correspondence with the left-handed transmission line.

APPENDIX 4

The power amplifier of the present invention can be according to any of the above appendixes 1 to 3,
wherein the first amplifier and the second amplifier are connected down stream to the input side balun circuit section in push-pull style.

APPENDIX 5

The power amplifier of the present invention can be according to any of the above appendixes 2 to 4,
wherein a relationship below is satisfied:

$$Q/f1 + P \cdot f1 = (2n+1) \cdot \pi,$$

wherein:

$$P = N2 \cdot 2 \cdot \pi \cdot (L2 \cdot C2)^{1/2},$$

wherein:

$$Q = N1/(2 \cdot \pi \cdot (L1 \cdot C1)^{1/2}),$$

wherein f1 is a frequency of an input signal,
wherein N1 is a total number of a plurality of unit cells in a left-handed transmission line,
wherein L1 is an inductance the inductor of each of the plurality of unit cells,
wherein C1 is a capacity of the condenser of each unit cell,
wherein the right-handed transmission line is shown as an equivalent circuit with distributed constants including a condenser, grounded and having a capacity C2, and a inductor, connected in series and having an inductance L2,
wherein N2 is a repeating number showing a phase difference generated between the left-handed transmission line and the right-handed transmission line is repeated in the frequency f1, and
wherein n is any integer.

APPENDIX 6

The power amplifier of the present invention can be according to the above appendix 5,
wherein the relationship below is satisfied:

$$Q/(2 \cdot f1) + 2 \cdot P \cdot f1 = (2n'+1) \cdot \pi,$$

wherein n' is any integer.

APPENDIX 7

The power amplifier of the present invention can be according to the above appendix 6,
wherein the any integer n and the any integer n' satisfy the relationships below:

$$n = 0, \text{ and}$$

$$n' = 0.$$

APPENDIX 8

The power amplifier of the present invention can be according to the above appendix 5,
wherein the relationship below is satisfied:

$$Q/(3 \cdot f1) + 3 \cdot P \cdot f1 = (2 \cdot n'') \pi,$$

wherein n'' is any integer.

APPENDIX 9

The power amplifier of the present invention can be according to the above appendix 8,
wherein any integer n and the any integer n'' satisfy the relationships below:

$$n = 1, \text{ and}$$

$$n'' = 1.$$

APPENDIX 10

The power amplifier of the present invention can be according to the above appendix 5,
wherein the relationships below are satisfied:

$$(2n'+1) \cdot \pi - \pi/3 < Q/(2 \cdot f1) + 2 \cdot P \cdot f1 < (2n'+1) \cdot \pi + \pi/3, \text{ and}$$

$$2n'' \cdot \pi + \pi/3 < Q/(3 \cdot f1) + 3 \cdot P \cdot f1 < 2n'' \cdot \pi + \pi/3,$$

wherein n' and n'' are two any integers.

APPENDIX 11

The power amplifying method of the present invention can comprise:

(a) a step of separating an input signal into a first signal and a second signal having a phase opposite to the first signal;

(b) a step of amplifying the first signal;

(c) a step of amplifying the second signal in a same condition as in the step (b); and (d) a step of inputting and overlapping a first amplified signal obtained in the step (b) and a second amplified signal obtained in the step (c), wherein the step (d) comprises:

(d-1) a step of transmitting the first amplified signal via a left-handed transmission line;

(d-2) a step of transmitting the second amplified signal via a right-handed transmission line; and (d-3) a step of overlapping a signal transmitted in the step (d-1) and a signal transmitted in the step (d-2).

The exemplary embodiment of the present invention has been explained above by referring to the attached drawings. The present invention is not limited by the above exemplary embodiment and can be modified as appropriate by a skilled person in a scope without departing from the spirit.

The present application is claimed with a priority based on Japanese Laid-Open Application 2009-023531 filed on Feb. 4, 2009 and its whole disclosure is included herein.

The invention claimed is:

1. A power amplifier comprising:
an amplifying circuit configured to amplify an input signal having a fundamental frequency to generate a first amplified signal and a second amplified signal of which a phase is opposed to said first amplified signal;
a first transmission line configured to add a first group of phases, different in correspondence with a frequency, to said first amplified signal by using a left-handed material to generate a first transmission signal;
a second transmission line configured to add a second group of phases, different in correspondence with a frequency, to said second amplified signal by using a right-handed material to generate a second transmission signal; and
a third transmission line configured to overlap said first and said second transmission signals to generate an output signal,
wherein said first and said second groups of phases comprises a phase difference configured to weaken a second harmonic and a third harmonic which have a frequency two times and three times higher than said fundamental frequency, respectively,
wherein said amplifying circuit comprises:
an input side balun circuit section configured to generate on the basis of an input signal a first signal and a second signal having a phase opposite to said first signal;
a first amplifier configured to amplify said first signal to generate said first amplified signal; and
a second amplifier configured to amplify said second signal in a same condition as said first amplifier to generate said second amplified signal, and
wherein said first amplifier and said second amplifier are connected downstream of said input side balun circuit section in a push-pull style.

2. The power amplifier according to claim 1,
wherein said first transmission line comprises a plurality of unit cells connected in series, and
wherein each of said plurality of unit cells comprises:
a transmission line;
an inductor of which one end is connected to said transmission line and of which the other end is grounded; and
a condenser connected to said transmission line in series.

3. The power amplifier according to claim 1,
wherein said second transmission line comprises a length configured to generate a given phase difference in correspondence with said first transmission line at said fundamental frequency.

4. The power amplifier according to claim 1,
wherein a difference between said first group of phases and said second group of phases is:
$\pi$ (modulo $2\pi$) radians at a fundamental frequency which said input signal has;
$\pi \pm \pi/3$ (modulo $2\pi$) radian at a frequency two times higher than said fundamental frequency; and
$\pi \pm \pi/3$ (modulo $2\pi$) radians at a frequency three times higher than said fundamental frequency.

5. A power amplifying method comprising:
(a) a step of amplifying an input signal having a fundamental frequency to generate a first amplified signal and a second amplified signal having a phase opposite to said first amplified signal;
(b) a step of adding a first group of phases, different in correspondence with a frequency, to said first amplified signal by using a left-handed material;
(c) a step of adding a second group of phases, different in correspondence with a frequency, to said second amplified signal by using a right-handed material; and
(d) a step of overlapping a first transmission signal obtained in said step (b) and a second transmission signal obtained in said step (c), and
wherein a phase difference configured to weaken a second harmonic and a third harmonic having a frequency two times and three times higher than said fundamental frequency, respectively, is included;
wherein step (c) includes:
generating by an input side balun circuit section on the basis of the input signal a first signal and a second signal having a phase opposite to said first signal,
amplifying by a first amplifier said first signal to generate said first amplified signal, and
amplifying by a second amplifier said second signal in a same condition as said first amplifier to generate said second amplified signal, and
wherein said first amplifier and said second amplifier are connected downstream of said input side balun circuit section in a push-pull style.

6. The power amplifier according to claim 2,
wherein said second transmission line comprises a length configured to generate a given phase difference in correspondence with said first transmission line at said fundamental frequency.

7. The power amplifier according to claim 2,
wherein a difference between said first group of phases and said second group of phases is:
$\pi$ (modulo $2\pi$) radians at a fundamental frequency which said input signal has;
$\pi \pm \pi/3$ (modulo $2\pi$) radian at a frequency two times higher than said fundamental frequency; and
$\pi \pm \pi/3$ (modulo $2\pi$) radians at a frequency three times higher than said fundamental frequency.

8. The power amplifier according to claim 6,
wherein a difference between said first group of phases and said second group of phases is:

π (modulo 2π) radians at a fundamental frequency which said input signal has;

π±π/3 (modulo 2π) radian at a frequency two times higher than said fundamental frequency; and π±π/3 (modulo 2π) radians at a frequency three times higher than said fundamental frequency.

9. The power amplifier according to claim 3, wherein a difference between said first group of phases and said second group of phases is:

π (modulo 2π) radians at a fundamental frequency which said input signal has;

π±π/3 (modulo 2π) radian at a frequency two times higher than said fundamental frequency; and π±π/3 (modulo 2π) radians at a frequency three times higher than said fundamental frequency.

\* \* \* \* \*

UNITED STATES PATENT AND TRADEMARK OFFICE
CERTIFICATE OF CORRECTION

PATENT NO. : 8,476,980 B2  Page 1 of 1
APPLICATION NO. : 13/147456
DATED : July 2, 2013
INVENTOR(S) : Akio Wakejima It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 57 days.

Signed and Sealed this
Eighth Day of September, 2015

Michelle K. Lee
*Director of the United States Patent and Trademark Office*